US009168907B2

(12) United States Patent
Neumann et al.

(10) Patent No.: US 9,168,907 B2
(45) Date of Patent: Oct. 27, 2015

(54) METHOD FOR TESTING A CONTAINER WARNING DEVICE OF A COMPENSATION CONTAINER, AND TESTING APPARATUS FOR TESTING A CONTAINER WARNING DEVICE

(75) Inventors: Hans-Jürgen Neumann, Rüsselsheim (DE); Peter Tandler, Kronberg (DE); Johann Ludwig, Steinbach (DE)

(73) Assignee: Continental Teves AG & Co. oHG (DE)

( * ) Notice: Subject to any disclaimer, the term of this patent is extended or adjusted under 35 U.S.C. 154(b) by 1372 days.

(21) Appl. No.: 12/679,105

(22) PCT Filed: Apr. 8, 2008

(86) PCT No.: PCT/EP2008/054214
§ 371 (c)(1),
(2), (4) Date: Apr. 20, 2010

(87) PCT Pub. No.: WO2009/000569
PCT Pub. Date: Dec. 31, 2008

(65) Prior Publication Data
US 2010/0308850 A1    Dec. 9, 2010

(30) Foreign Application Priority Data

Jun. 22, 2007  (DE) .................. 10 2007 029 331
Aug. 24, 2007  (DE) .................. 10 2007 040 044

(51) Int. Cl.
*G01R 27/08*  (2006.01)
*B60T 17/22*  (2006.01)
(Continued)

(52) U.S. Cl.
CPC ............. *B60T 17/225* (2013.01); *B60T 11/26* (2013.01);
(Continued)

(58) Field of Classification Search
CPC ............... H01L 2924/00; H01L 2924/0002; G01R 27/02; G01R 27/08; G01R 27/14; G01R 1/203
USPC ................................... 324/705, 606
See application file for complete search history.

(56) References Cited

U.S. PATENT DOCUMENTS

| 2,882,648 | A | * | 4/1959 | Hovgaard et al. ............. 65/32.2 |
| 3,228,021 | A | * | 1/1966 | Lehmer ............................. 377/3 |
| 3,510,760 | A | * | 5/1970 | Wagar et al. .................. 324/419 |
| 3,586,961 | A | * | 6/1971 | Rovnyak ....................... 324/419 |
| 3,723,858 | A | * | 3/1973 | Moister, Jr. ................... 324/419 |
| 4,028,615 | A |   | 6/1977 | Jansen et al. |
| 4,992,738 | A | * | 2/1991 | May et al. .................. 205/779.5 |

(Continued)

FOREIGN PATENT DOCUMENTS

| DE | 10 2005 009 657 A1 | 11/2005 |
| DE | 10 2005 008 657 A1 | 8/2006 |
| GB | 1 529 714 | 10/1978 |

OTHER PUBLICATIONS

Bogdan Miedzinski and M. Kristiansen; Analytical and Experimental Investigations of Reed Contact Bouncing; IEEE Transactions on Components, Hybrids, and Manufacturing Technology, vol. 1 I, No. 2, Jun. 1988; pp. 200-210.*

*Primary Examiner* — Jermele M Hollington
*Assistant Examiner* — Christopher McAndrew
(74) *Attorney, Agent, or Firm* — RatnerPrestia

(57) ABSTRACT

A method for testing a reservoir warning apparatus of a fluid reservoir for a hydraulic motor vehicle brake system, with the reservoir warning apparatus comprising a switching unit with at least one reed contact as the switching element. In order to find all possible faults in the reed contact, a dynamic contact resistance and a transient response of the reed contact are measured at the preassembled switching unit.

15 Claims, 3 Drawing Sheets

(51) Int. Cl.
*B60T 11/26* (2006.01)
*G01F 23/72* (2006.01)
*H01H 36/02* (2006.01)
*G01R 27/02* (2006.01)
*G01R 27/14* (2006.01)
*G01R 1/20* (2006.01)

(52) U.S. Cl.
CPC .............. *G01F 23/72* (2013.01); *H01H 36/02* (2013.01); *G01R 1/203* (2013.01); *G01R 27/02* (2013.01); *G01R 27/14* (2013.01); *H01L 2924/00* (2013.01); *H01L 2924/0002* (2013.01)

(56) References Cited

U.S. PATENT DOCUMENTS

| | | | |
|---|---|---|---|
| 5,065,101 A | 11/1991 | Ledbetter | |
| 5,410,488 A * | 4/1995 | Andersen, III | 702/158 |
| 5,796,254 A * | 8/1998 | Andrus | 324/419 |
| 5,916,463 A * | 6/1999 | Hoving et al. | 219/121.85 |
| 6,871,663 B2 * | 3/2005 | Groeneveld | 137/271 |
| 7,411,407 B2 * | 8/2008 | Rearick et al. | 324/713 |
| 2007/0069760 A1 * | 3/2007 | Lite | 324/765 |
| 2007/0143047 A1 * | 6/2007 | Rearick et al. | 702/64 |
| 2008/0041976 A1 * | 2/2008 | Bohlmann | 239/533.2 |
| 2008/0216795 A1 | 9/2008 | Dietz et al. | |

* cited by examiner

METHOD FOR TESTING A CONTAINER WARNING DEVICE OF A COMPENSATION CONTAINER, AND TESTING APPARATUS FOR TESTING A CONTAINER WARNING DEVICE

CROSS REFERENCE TO RELATED APPLICATIONS

This application is the U.S. national phase application of PCT International Application No. PCT/EP2008/054214, filed Apr. 8, 2008, which claims priority to German Patent Application No. 10 2007 029 331.5, filed Jun. 22, 2007, and German Patent Application No. 10 2007 040 044.8, filed Aug. 24, 2007, the contents of such applications being incorporated by reference herein.

FIELD OF THE INVENTION

The invention relates to a method for testing a reservoir warning apparatus of a fluid reservoir, in particular for a hydraulic motor vehicle brake system, with the reservoir warning apparatus comprising a switching unit with at least one reed contact as the switching element, and to a test apparatus for testing a reservoir warning apparatus.

BACKGROUND OF THE INVENTION

In a hydraulic motor vehicle brake system, the required brake fluid is located in the fluid reservoir, with the reservoir warning apparatus for monitoring the reservoir filling level usually having a reed switch with a reed contact as the switching element and usually having a magnet as the transducer.

As is known, a reed contact comprises two ferromagnetic reeds which are coated with noble metal and are fused into a glass body or small glass tube. The two reeds overlap to a minimum extent in this case. The small glass tube is evacuated before fusing and partly filled with nitrogen or a gas mixture with a high nitrogen content.

If the level of brake fluid falls and the magnet passes a predefined switching point, the reeds of the reed switch close on account of the generated magnetic field since the magnetic attraction force of the reeds exceeds the spring action of the individual reeds. The reed switch can, as described, be provided as a closer or NO switch in which the reeds are open in the inoperative position. However, it is also possible to use a reed switch which is in the form of an opener or an NC switch which has reeds which are closed in the inoperative state and are opened under the action of a magnetic force.

This signal is evaluated in a controller and the driver of the motor vehicle can be warned by way of an optical and/or acoustic indicator. In this case, it is necessary to ensure that the fluid reservoir is always filled with a statutorily predefined minimum amount of brake fluid in order to not compromise the functioning of the brake system. Reservoir warning apparatuses for monitoring the reservoir filling level in which a float, which is provided with the magnet, switches the reed contact as soon as the float assumes a position (switching point) in which the reservoir filling level falls below a defined minimum are generally used. A warning signal which can be sensed by the driver is triggered by the reed contact.

A fluid reservoir for a hydraulic motor vehicle brake system and a described switching unit are known, for example, from DE 10 2005 009 657 A1.

In line with current practice, the reservoir warning apparatuses are subject to a switching point test and a pivoting test (180° rotation) in the installed state, that is to say after installation of the reservoir warning apparatus into the fluid reservoir.

In spite of these tests, the switching units with reed contacts often fail since some manufacturer faults are not found by the switching point test and pivoting test and subsequent faults can occur in the field due to handling (transportation, assembly etc.).

Possible faults or failures which can occur in an installed reed contact in the field are:
- Broken glass body (hairline cracks)
- Leaks between the glass body and contacts
- Floating particles in the glass body
- Bent reeds in the glass body
- Skewed orientation of the reeds in the glass body
- Tendency for the reeds to stick in the contact region

SUMMARY OF THE INVENTION

Therefore, it is an object of the invention to provide a test method and a test apparatus with which all possible faults in the reed contact can be found.

The object is achieved by the method for testing a reservoir warning apparatus according to the invention, which method provides for a dynamic contact resistance and a transient response of the reed contact to be measured at the preassembled switching unit. This test can identify all possible faults at the preassembled switching unit since possible negative influences caused by handling and assembly have already taken place on the reed contact.

According to one advantageous embodiment of the method according to the invention, the sensitivity of a pull-in excitation and a drop-out excitation of the reed contact is measured at the preassembled switching unit. This can be used to determine whether the sensitivity of the reed contact which was previously defined for functioning can be maintained.

A static contact resistance of the reed contact is preferably measured at the premounted switching unit. This value is also previously defined for functioning and can be checked using this method step.

As a further advantageous method step, a switching path and a switching time can be measured at the preassembled switching unit.

The test steps are preferably integrated in the production process of the switching unit. As a result, additional handling of the switching units can be avoided.

According to one advantageous development of the method according to the invention, at least two measurements of the static contact resistance are carried out and a difference between the resistances is determined.

In this case, ten measurements of the static contact resistance are preferably carried out and a maximum difference between the resistances is determined.

A further advantageous development makes provision for at least two measurements of the dynamic contact resistance to be carried out and a difference between the resistances to be determined.

It is particularly advantageous when a hundred measurements of the dynamic contact resistance are carried out and a maximum difference between the resistances is determined.

In order to record the measurements, the switching unit is preferably identified with the test values.

According to one advantageous embodiment, a particularly advantageous identifier is provided by the individual test values being transmitted to the switching unit encrypted in the form of the data matrix code. Therefore, the test values can be encoded in a highly compact manner.

In this case, the identifier is applied particularly easily and reliably by the data matrix code being lasered onto the Switching unit.

The object is also achieved by a test apparatus for testing a reservoir warning apparatus, which test apparatus permits testing in line with the method according to aspects of the invention.

The test apparatus is preferably integrated in a production unit.

BRIEF DESCRIPTION OF THE DRAWINGS

The invention is best understood from the following detailed description when read in connection with the accompanying drawings. Included in the drawings is the following figures.

DETAILED DESCRIPTION OF THE PREFERRED EMBODIMENTS

Figure 1:
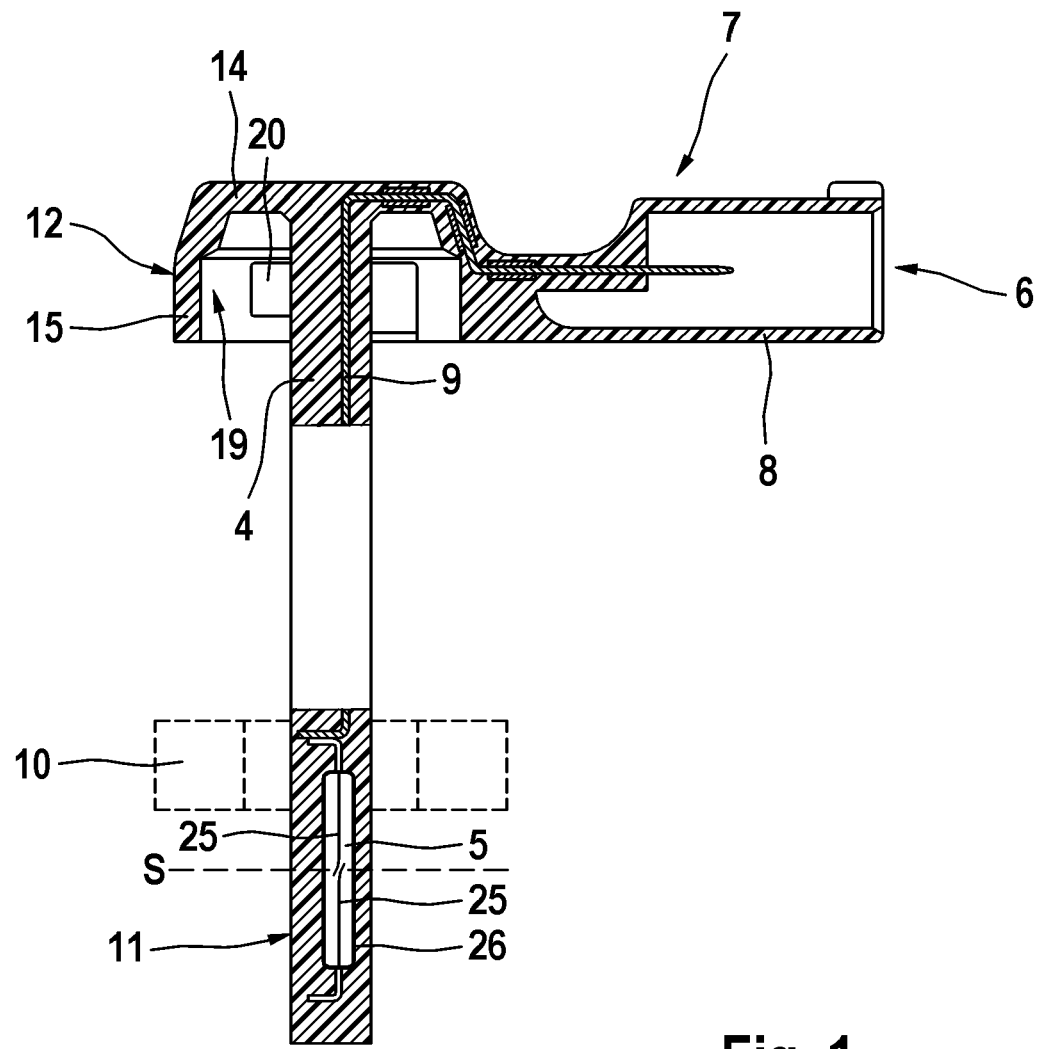
FIG. 1 shows a longitudinal section through a switching unit of a reservoir warning apparatus of a fluid reservoir.
Figure 2:
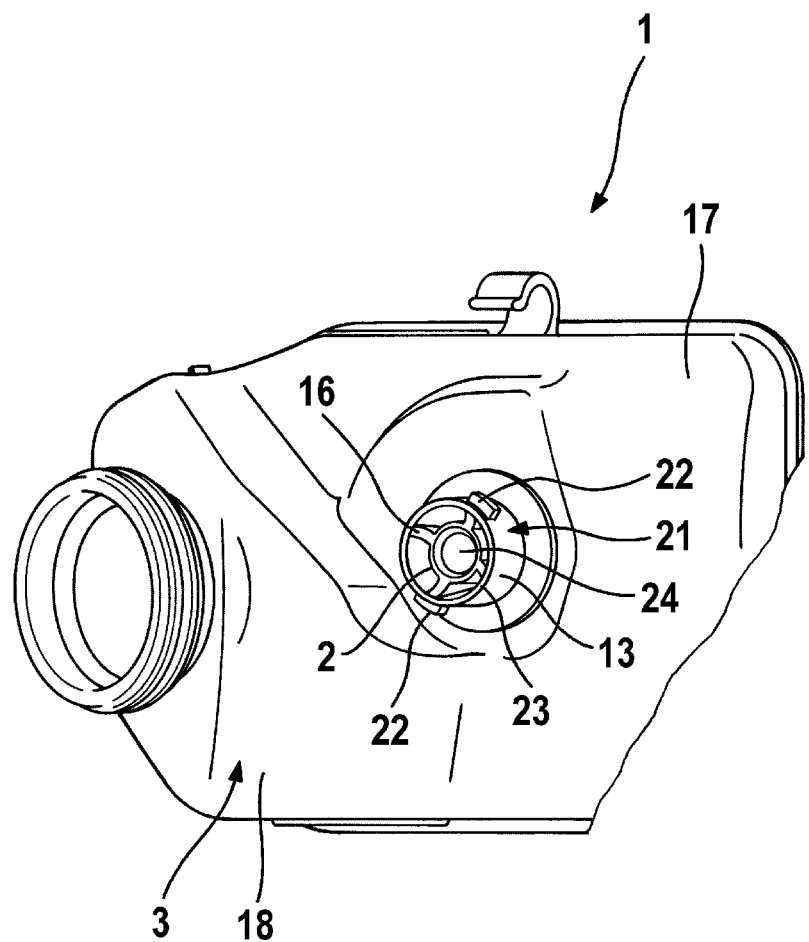
FIG. 2 shows a three-dimensional plan view of a corresponding fluid reservoir of a hydraulic motor vehicle brake system.

FIGS. 1 and 2 respectively show longitudinal section through a switching unit 7 of a reservoir warning apparatus of a fluid reservoir 1 and a three-dimensional plan view of the corresponding fluid reservoir 1 which is fixed, for example, to a master cylinder (not illustrated) of a hydraulic motor vehicle brake system. The described test method can be employed in the switching unit 7, which is illustrated by way of example, by means of the described test apparatus.

Fluid reservoirs and their components for hydraulic motor vehicle brake systems are generally known. The method according to the invention and the test apparatus according to the invention can be applied, in principle, to all reservoir warning apparatuses which have a switching unit with a reed contact.

The fluid reservoir 1 consists of a housing 3 comprising a housing lower part and a housing upper part, these housing parts being welded to one another at their edges and at intermediate walls, and has a guide tube 2, which projects into the interior of said fluid reservoir and is closed at its end which faces the interior of the reservoir.

A schematically indicated float 10 is displaceably arranged along the guide tube 2, which has a circular cross section for example, said float being formed, for example, as a ring and representing a constituent part of a reservoir warning apparatus for monitoring the reservoir filling level. The float 10 is fitted with an annular magnet as a magnetic transducer. A first stop which towers from the base of the fluid reservoir 1 limits the displacement of the float on the guide tube 2 in the direction of the base. This stop defines the deepest position of the float 10 in the fluid reservoir 1 and prevents the float from being able to leave the guide tube 2.

The float 10 can be integral and have a radial cutout into which the annular magnet is inserted. In this case, side walls of the cutout are provided with holding means which secure the magnet in its installation position. The magnet can be provided as a plastic-bound permanent magnet, as a result of which the magnet is fracture-resistant and splintering of the magnet, which in the worst-case scenario can lead to the float 10 becoming wedged into the guide tube 2, can be avoided.

The reservoir warning apparatus for monitoring the reservoir filling level comprises the switching unit 7 with a contact support 4 which is provided in the interior of the guide tube 2 and is fixed to the one reed switch with a reed contact 5 as the switching element. The switching unit 7 can also have a plurality of reed contacts 5. Furthermore, the switching unit 7 comprises a plug connector 6 with a housing 8 and can, in order to facilitate assembly and to simplify production of the switching unit 7, be integrally formed from a plastics material, as illustrated. Contact lugs 9, to which the reed switch 5 is fixed, and other components, for example resistors, are, for example, injection-molded into the contact support 4.

As soon as the magnet passes a switching point S of the reed contact 5 due to a drop in the reservoir filling level, reeds of the reed contact 5 close due to the magnetic field generated by the magnet since the magnetic attraction force of the reeds exceeds the spring action of the individual reeds. The reed contact 5 can be provided as a closer or NO switch, in which the reeds are open in the inoperative position. However, it is also possible to use a reed contact 5 which is in the form of an opener or NC switch which has reeds which are closed in the inoperative state and are opened under the action of a magnetic force. The switching process generates a signal for an electronic switching unit of the motor vehicle brake system.

In other embodiments of the fluid reservoir 1, the switching unit extends from a side wall into the pressure chambers, with the magnetic transducer being arranged above the switching unit. Arrangement of the switching unit at the base of the fluid reservoir is also feasible.

FIG. 1 shows the arrangement of the reed switch 5 only schematically. Therefore, it is feasible to arrange the reed contact 5 in a recess in the contact support 4 and to fix said reed contact to the contact lugs 9 in said recess. In order to protect the reed contact 5, said reed contact can, as indicated in FIG. 1, be embedded in the material of the contact support 4. To this end, the contact support 4 can be extrusion-coated with the same material in the region of the reed contact 5, for example, or a section 11 of the contact support 4, which section projects into a guide tube 2 of the fluid reservoir 1, can be encased after the reed contact 5 is fixed.

Figure 3:
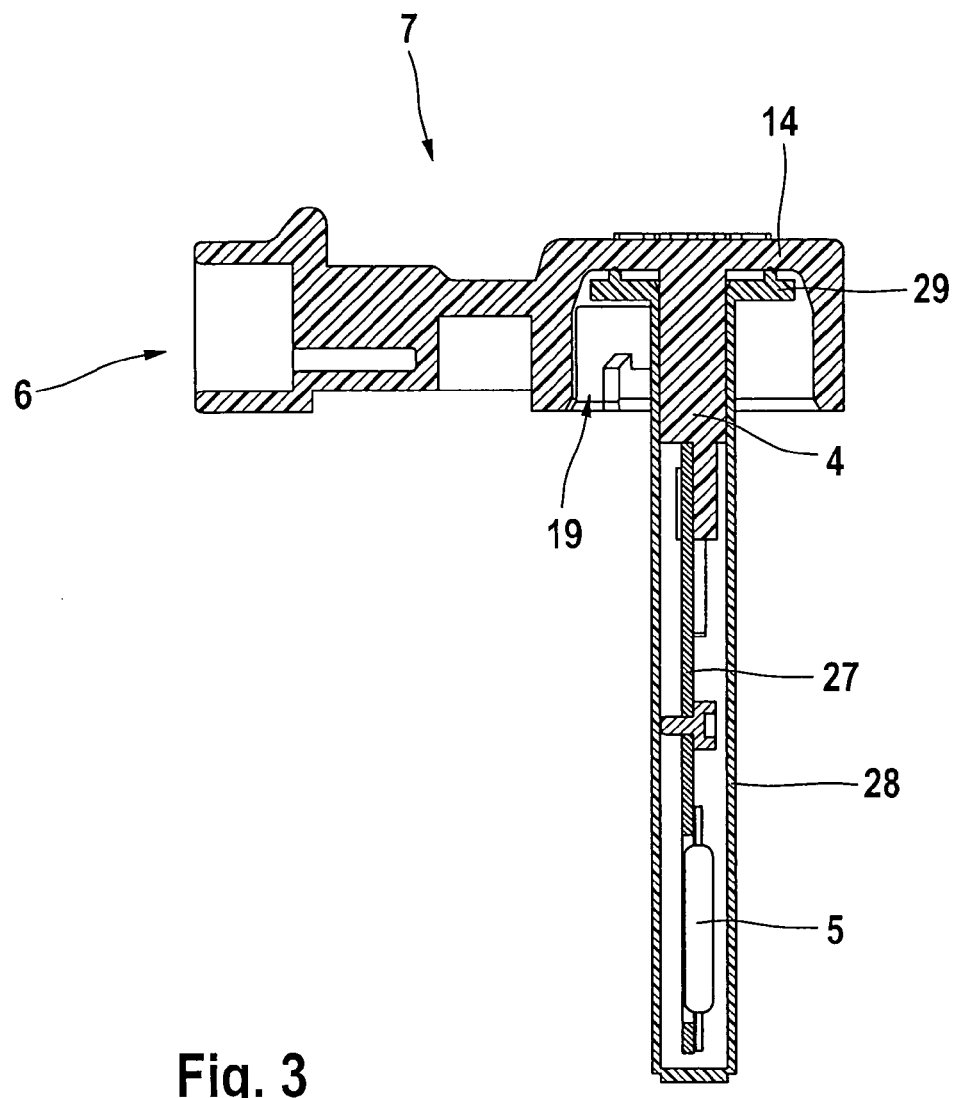
FIG. 3 shows a longitudinal section through a second embodiment of a switching unit of a reservoir warning apparatus of a fluid reservoir.

As an alternative, the reed contact 5 can be fixed to a printed circuit board 27 which is fixed to the contact support 4, as can be seen in FIG. 3. The printed circuit board 27 and a portion of the contact support 4 are, in order to be protected, surrounded by a tubular casing 28 which is welded to the contact support 4 by way of a flange 29 and is closed in the direction of the interior of the reservoir. In this embodiment of the switching unit 7, the casing 28 projects into the guide tube 2.

In order to be able to releasably connect the switching unit 7 to the housing 3 of the fluid reservoir 1, the contact support 4 can have a pot-like section 12 which interacts with an annular projection 13 which is formed on the housing 3. That section 11 of the contact support 4 which is fitted with the reed contact 5 extends centrally from a base 14 of the pot-like section 12, and the housing 8 of the plug connector 6 is integrally formed on a wall 15 of the pot-like section 12 perpendicular in relation to a longitudinal axis of the switching unit 7.

If the reed contact 5 according to FIG. 3 is arranged on the printed circuit board 27, the flange 29 of the casing 28 is welded to an inner face 19 of the pot-like section 12 in the region of a base 14.

As can also be seen, the guide tube 2 is provided concentrically within the annular projection 13, with reinforcing ribs 16, which are illustrated in FIG. 1, being provided between the annular projection 13 and the guide tube 2 in order to reinforce the fluid reservoir 1 in the region of the annular projection 13.

In order to optimize the packaging of the fluid reservoir 1, the annular projection 13 is arranged in a region 17 of the housing 3 which is offset in the direction of the interior of the reservoir compared to the remaining region 18 of the housing 3. Therefore, the switching unit 7 does not project beyond the housing 3 and cannot form an obstruction either during transportation or in the installed state of the fluid reservoir 1. Furthermore, the housing geometry shown can prevent the switching unit 7 from being installed in an incorrect position—for example rotated through 180° in relation to its longitudinal axis.

A releasable connection between the contact support 4 and the circumferential projection 13 can be, for example, a bayonet connection which comprises two diametrically opposite apertures 20 with undercuts on the inner face 19 of the pot-like section 12, and two diametrically opposite ribs 22 on an outer face 21 of the annular projection 13. This connection allows the switching unit 7 to be easily replaced without using a tool, with the undercuts preventing undesired release of the connection. In this case, it is also possible to provide other latching connections, for example a snap-action connection with sprung snap-action elements and corresponding elements for the snap-action elements to snap into.

The annular projection 13 is of sprung design and the edge 23 of said projection rests tightly against the inner face 19 of the pot-like section 12. As a result, the annular projection 13 has a double function since the projection 13 firstly protects an interior 24 of the guide tube 2 against the ingress of splash water and secondly presses the apertures 20 towards the ribs 22 of the bayonet connection. The direction of rotation of the switching unit 7 is defined by virtue of the design of the ribs 22 and the apertures 20 and takes place either in the counterclockwise direction or in the clockwise direction until the bayonet connection latches in. The switching unit 7 is removed by pressing the switching unit 7 towards the edge 23 of the annular projection 13 and rotating it in the counterclockwise direction or in the clockwise direction until the bayonet connection is released.

In order to obtain a functionally reliable and robust switching unit 7 of the reservoir warning apparatus while at the same time reducing costs, the reed contact 5 and the magnet can be matched to one another, so as to optimize switching, in such a way that the magnet switches at a single switching lobe of the reed contact 5 by the magnetic flux density of the magnet and the switching sensitivity of the switching unit 7 being matched to one another. As a result, only a so-called main lobe of the reed contact 5 is effective and the defined switching response at the predefined switching point S is ensured, as a result of which exact positioning of the stops can be dispensed with or as a result of which the stops can be completely dispensed with.

The reed contact 5, which is schematically illustrated in FIG. 1, consists of two ferromagnetic reeds 25 which are coated with noble metal and are fused into a glass body or small glass tube 26. The two reeds 25 overlap to a minimum extent in this case. The small glass tube 26 is evacuated before fusing and partly filled with nitrogen or a gas mixture with a high nitrogen content.

The method according to the invention for testing a reservoir warning apparatus, which method provides for a dynamic contact resistance and a transient response of the reed contact to be measured at the preassembled switching unit 7, as illustrated in FIG. 1. This test can identify all possible faults at the preassembled switching unit 7 since possible negative influences caused by handling and assembly have already taken place on the reed contact 5. Possible faults are: broken small glass tube 26 (hairline cracks), leaks between the small glass tube and reeds 25, floating particles in the small glass tube 26, bent reeds 25 in the small glass tube 26, skewed orientation of the reeds 25 in the small glass tube 26, tendency for the reeds 25 to stick in the contact region, etc.

In order to measure the dynamic contact resistance, the reed contact 5 of the switching unit 7 is switched at a specific frequency of, for example, 100 Hz, it being possible for the measurement result to be indicated by means of an oscillograph. The measurement result can likewise be digitized.

By clocking the reed contact 5 at the specific frequency, the reed contact 5 is periodically opened and closed for a specific time period. The reed contact 5 bounces for approximately 0.1 ms, this is followed by the so-called dynamic noise for approximately 0.5 ms during which the reed contact 5 is not yet closed and vibrates without opening. In this case, the contact resistance continues to vary within large limits and improves continuously during the first 0.5 ms. When the dynamic noise has abated, the last transient recovery phase begins. Although the contact is closed in the process, it still takes approximately 1 ms until the final closed position with the fixed contact resistance is reached. That is to say, the reed contact 5 has reached its operating position approximately 1.5 ms after the measuring coil voltage is applied. Therefore, the transient response allows conclusions to be drawn about the quality of the reed contact 5: if an increased bounce time of more than 0.25 ms arises, an increased risk of failure of the reed contact 5, especially in the case of load-free switching, can be expected.

If noise or the transient oscillation increases over the specific time of 1.5 ms or if the transient curve exhibits increased amplitude values, it can be concluded that a fusing zone is faulty or the small glass tube 26 is broken.

This test step is repeated in, for example, approximately 100 measurements, in order to determine a maximum difference in the dynamic contact resistance. As a result, it can be concluded that the interior of the reed contact 5 is soiled, that mechanical strain is present or else faulty reed surfaces are present, if the contact resistance changes during the measurements.

In order to determine whether the sensitivity of the reed contact 5 which was previously defined for functioning is maintained, the sensitivity of a pull-in excitation and a drop-out excitation of the reed contact 5 is measured by means of a special measuring coil before the dynamic content resistance is measured.

As a further test step, this can be followed by measurement of the static contact resistance of the reed contact 5. This value is also previously defined for functioning and can be checked using this method step.

Approximately 10 measurements are carried out in order to determine a maximum difference in the static contact resistance.

Measurement of the dynamic contact resistance is followed, as the next method step, by measurement of the switching path and of the switching time of the preassembled switching unit 7 using a magnet, as is used in the fluid reservoir.

For recording purposes, the switching units 7 are identified with the test values. To this end, the individual test values are lasered onto the switching unit 7 in encrypted form, for example as data matrix code.

The above-described test steps are carried out by means of a test apparatus which is integrated in the production process of the switching unit 7, as a result of which additional handling of the switching units 7 can be avoided.

The invention claimed is:

1. A method for testing a reservoir warning apparatus of a fluid reservoir for a hydraulic motor vehicle brake system, with the reservoir warning apparatus comprising a switching unit with at least one reed contact as the switching element, comprising:
    applying a periodic signal to the switching unit to periodically switch the reed contact to a final closed position;
    measuring a dynamic contact resistance and a transient response of the reed contact of the switching unit in a preassembled state after the signal is applied to the switching unit and before the reed contact reaches the final closed position during the periodic switching of the reed contact; and
    identifying possible faults based on multiple measurements of the dynamic resistance and/or transient response measured after the signal is applied to the switching unit and before the reed contact reaches the final closed position during the periodic switching of the reed contact, the multiple measurements occurring in different periods of the periodic switching.

2. The method for testing a reservoir warning apparatus as claimed in claim 1, wherein the sensitivity of a pull-in excitation and a drop-out excitation of the reed contact is measured at the preassembled switching unit.

3. The method for testing a reservoir warning apparatus as claimed in claim 1, wherein a static contact resistance of the reed contact is measured at the preassembled switching unit.

4. The method for testing a reservoir warning apparatus as claimed in claim 1, wherein a switching path and a switching time are measured at the preassembled switching unit.

5. The method for testing a reservoir warning apparatus as claimed in claim 1, wherein the test steps are integrated in the production process of the switching unit.

6. The method for testing a reservoir warning apparatus as claimed in claim 1, wherein at least two measurements of the static contact resistance are carried out and a difference between the resistances is determined.

7. The method for testing a reservoir warning apparatus as claimed in claim 6, wherein at least ten measurements of the static contact resistance are carried out and a maximum difference between the resistances is determined.

8. The method for testing a reservoir warning apparatus as claimed in claim 1, wherein at least two measurements of the dynamic contact resistance are carried out and a difference between the resistances is determined.

9. The method for testing a reservoir warning apparatus as claimed in claim 8, wherein at least one hundred measurements of the dynamic contact resistance are carried out and a maximum difference between the resistances is determined.

10. The method for testing a reservoir warning apparatus as claimed in claim 1, wherein the switching unit is identified with test values.

11. The method for testing a reservoir warning apparatus as claimed in claim 10, wherein the individual test values are transmitted to the switching unit encrypted in the form of the data matrix code.

12. The method for testing a reservoir warning apparatus as claimed in claim 11, wherein the data matrix code is lasered onto the switching unit.

13. A test apparatus for testing a reservoir warning apparatus, the test apparatus comprising:
    means for applying a periodic signal to the switching unit to periodically switch the reed contact to a final closed position;
    means for measuring a dynamic contact resistance and a transient response of the reed contact of the switching unit in a preassembled state after the signal is applied to the switching unit and before the reed contact reaches the final closed position during the periodic switching of the reed contact; and
    means for identifying possible faults based on multiple measurements of the dynamic resistance and/or transient response measured after the signal is applied to the switching unit and before the reed contact reaches the final closed position during the periodic switching of the reed contact, the multiple measurements occurring in different periods of the periodic switching.

14. The test apparatus as claimed in claim 13, wherein the test apparatus is integrated in a production unit.

15. The method for testing a reservoir warning apparatus as claimed in claim 1, wherein the signal switches the reed contact at a specific frequency.

* * * * *